United States Patent [19]

Wu et al.

[11] Patent Number: 5,209,812
[45] Date of Patent: May 11, 1993

[54] HOT FILAMENT METHOD FOR GROWING HIGH PURITY DIAMOND

[75] Inventors: Ching-Hsong Wu, Farmington Hills, Mich.; Michael A. Tamor, Toledo, Ohio; Timothy J. Potter, Dearborn, Mich.

[73] Assignee: Ford Motor Company, Dearborn, Mich.

[21] Appl. No.: 506,633

[22] Filed: Apr. 9, 1990

[51] Int. Cl.$^5$ .............................................. C30B 25/06
[52] U.S. Cl. ........................... 156/613; 156/DIG. 68; 423/446; 501/86; 427/585
[58] Field of Search ....................... 156/613, DIG. 68; 423/446; 501/86; 427/39

[56] References Cited

U.S. PATENT DOCUMENTS

| | | | |
|---|---|---|---|
| 2,996,415 | 8/1961 | Hergenrother | 156/DIG. 68 |
| 3,030,187 | 4/1962 | Eversole | 423/446 |
| 3,142,539 | 7/1964 | Brinkman et al. | 156/DIG. 68 |
| 3,630,678 | 12/1971 | Gardner | 156/DIG. 68 |
| 4,434,188 | 2/1984 | Kamo et al. | 427/39 |
| 4,707,384 | 11/1987 | Schachner et al. | 427/249 |
| 4,740,263 | 4/1988 | Imai et al. | 156/613 |

FOREIGN PATENT DOCUMENTS 3522583  6/1986  Fed. Rep. of Germany ...... 427/248

OTHER PUBLICATIONS

J. C. Angus and C. C. Hayman, Science 241, 913 (1988).
B. V. Spitsyn, L. L. Bouilov, and B. V. Derjaguin, Journal of Crystal Growth 52, 219 (1981).
Matsumoto, Y. Sato, M. Kamo, and N. Setaka, Japanese Journal of Applied Physics 21, L183 (1982).
Y. Mirose and Y. Terasawa, "Synthesis of Diamond Thin Films by Thermal CVD Using Organic Compounds", Japanese Journal of Applied Physics, Part 2, vol. 25, L519-21 (1986).
S. Matsumoto, Y. Sato, M. Kamo, N. Setaka, "Vapor Deposition of Diamond Particles from methane", Japanese Journal of Applied Physics, vol. 21, No. 4, (Apr. 1982), pp. L183-L185.
K. Kobashi, K. Nishimura, Y. Kawate, T. Horiuchi, "Synthesis of Diamonds by Use of Microwave Plasma Chemical-Vapor Deposition: Morphology and Growth of Diamond Films", *Physical Review*, vol. 38, No. 6, (Aug. 15, 1988) II, pp. 4067–4083.
"Synthesis of diamond by laser-induced chemical vapor deposition"; Kitahama, Katsuki et al; Applied Physics Letters, 49(11), 634–5 (1986).

*Primary Examiner*—Robert Kunemund
*Assistant Examiner*—FeLisa Garrett
*Attorney, Agent, or Firm*—Joseph W. Malleck; Roger L. May

[57]  ABSTRACT

A method of growing high purity diamond crystallite structures at relatively high growth rates on a temperature resistant substrate, comprising (a) flowing diamond producing feed gases at low pressure through a reaction chamber containing the substrate, the feed gases being comprised of hydrocarbon devoid of methyl group gases, i.e., acetylene or ethylene, diluted by hydrogen, and (b) while concurrently raising the temperature of the substrate to the temperature range of 600°–1000° C., thermally activating the feed gases by use of a hot filament located within the chamber and upstream and adjacent the substrate, the filament being heated to a temperature above 1900° C., that is effective to generate a substantial atomic hydrogen (H) concentration and carbon containing free radicals. A substantial additional loss in carbon balance of the gases is triggered at a lower filament temperature indicative of the formation of intermediate substances that stimulate diamond growth. The gases may be mixed prior to passing the filament and may include CO or equivalent gases to enhance diamond purity. Alternatively, the gases are delivered in a substantially nonmixed condition past said filament and are substantially mixed for the first time at the surface of the substrate.

14 Claims, 8 Drawing Sheets

HOT FILAMENT METHOD FOR GROWING HIGH PURITY DIAMOND

BACKGROUND OF THE INVENTION

1. Technical Field

This invention relates to the art of depositing polycrystalline diamond films by low pressure chemical vapor deposition, and more particularly to hot filament chemical vapor deposition techniques.

2. Discussion of the Prior Art

The technology of low pressure chemical vapor deposition (hereinafter CVD) of polycrystalline diamond films has advanced in recent years (see J.C. Angus and C.C. Hayman, Science 241, 913 (1988); B.V. Spitsyn, L.L. Bouilov, and B.V. Derjaguing Journal of Crystal Growth 52, 219 (1981); and S. Matsumoto, Y. Sato, M. Kamo, and N. Setaka, Japanese Journal of Applied Physics 21, L183 (1982)). However, fundamental understanding of the chemistry and Physics occurring in this CVD process is still lagging. The mechanism by which diamond is formed is not clear to the prior art, particularly with respect to intermediate substances that may be required for stimulating diamond crystal growth.

This invention is directed to a method of using hot filament CVD that makes more clear the role of intermediate substances. Hot filament CVD is desirable because of its (a) low capital cost, and (b) ease to scale up. It is important to distinguish other low Pressure CVD techniques from hot filament CVD; such other techniques may comprise activation by radio frequency (RF) or microwave plasma, ion electron assisted CVD, RF sputtering, and ion beam. These other techniques are substantially different because the formation of electrically charged species will proceed in different chemical and physical reactions than those of neutral radical species produced by hot filament CVD.

Although hot filament CVD is desirable from an economic and scale up capability standpoint, it is limited by filament durability and accepted feed gases to produce less than optimum quality diamond. This invention has discovered a way to deposit diamond at high growth rates and with a desirable quality using hot filament CVD but with hydrocarbon feed gases which do not contain methyl group gases and at lower equivalent filament temperatures.

Two bodies of prior art are pertinent to this discovery: hot filament CVD using methyl containing feed gases, and other low pressure CVD techniques using non-methyl containing group feed gases.

Hot filament CVD prior art is exemplified in the following: (a) Y. Hirose and Y. Terasawa, 'Synthesis of Diamond Thin Films by Thermal CVD Using Organic Compounds', Japanese Journal of Applied Physics, Part 2, Volume 25, L519-21 (1986); (b) S. Matsumoto, Y. Sato, M. Kamo, N. Setaka, 'Vapor Deposition of Diamond Particles from Methane', Japanese Journal of Applied Physics, Volume 21, No. 4, April 1982, pp. L183-L185; and (c) U.S. Pat. No. 4,707,384 and corresponding German Patent DE 3,522,583. All of these references rely on methyl group containing feed gases for the hot filament technique, although reference is made to using non-methyl gases when not working with hot filament techniques. The reason for the inability to explore non-methyl gases with the hot filament CVD technique is due to accepted attitudes (such as represented in U.S. Pat. Nos. 3,030,187 and 3,030,188) that non-methyl containing HC will not produce diamond growth.

The state of the art with respect to CVD techniques other than hot filament, such as microwave plasma and electron assisted heating, reference should be made to the following articles and patents: (a) K. Kobashi, K. Nishimura, Y. Kawate, T. Horiuchi, 'Synthesis of Diamonds by Use of Microwave Plasma Chemical-Vapor Deposition: Morphology and Growth of Diamond Films', Physical Review, Volume 38, No. 6, Aug. 15, 1988 II, pages 4067-4083; and (b) U.S. Pat. Nos. 4,740,263, and 4,434,188.

The article to Kobashi et al is most emphatic in presenting a negative teaching with respect to hot filament CVD when using hydrocarbon feed gases which do not contain methyl group, such hydrocarbons being acetylene or ethylene. It is representative of the state of technical understanding that professes that it is not possible to use acetylene and ethylene with thermal filament CVD diamond methods (see the third paragraph, page 4071, of the article to Kobashi et al, Physics Review, 38 (1988)).

U.S. Pat. No. 4,740,263 is not helpful with respect to hot filament techniques since it utilizes acetylene only with respect to electron assisted CVD. In electron assisted CVD, extra energy must be supplied to cause diamond crystal nuclei to form and grow to a thin film with electron bombardment. The extra energy is supplied by DC voltage bias. A direct current voltage (for example, 150 volts with 20 mA/cm$^2$ as described in example 1, and 1000 volts with 80 mA/cm$^2$ as described in example 6) between the filament and the substrate (positive voltage) is required in order to emit and accelerate electrons and to cause bombardment on the substrate surface. Electron assisted CVD which causes ionization of molecules and radicals in gas Phase and on the substrate surface is different from hot filament CVD. Electron bombardment is not desirable because of a dislocation of the lattice structure. In U.S. Pat. No. 4,434,188, microwave plasma is used at unusually low temperatures; this leads to a much lower deposition rate and similar dislocation.

SUMMARY OF THE INVENTION

The invention is a method of growing high purity diamond crystallite structures at relatively high growth rates on a substrate that can withstand high temperatures (i.e., up to 1000° C). The process comprises essentially two steps: (a) flowing diamond producing feed gases at low pressure through a reaction chamber containing the substrate, the feed gases being comprised of hydrocarbon diluted by hydrogen and being substantially devoid of methyl group gases; and (b) while concurrently raising the temperature of the substrate to the temperature range of 600°-1000° C., thermally activating the feed gases by use of a hot filament located within the chamber and upstream and adjacent the substrate, the filament being heated to a temperature above 1900° C., that is effective to generate a substantial atomic hydrogen (H) concentration and carbon containing free radicals. A substantial additional loss in carbon balance of the gases is triggered at a lower filament temperature indicative of the formation of intermediate substances that stimulate diamond growth.

The non-methyl containing (NMHC) hydrocarbons of the feed gases are selected from the group consisting of acetylene and ethylene. In a first embodiment, the gases, consisting of NMHC and hydrogen, are mixed prior to passing the filament. In this first embodiment, diamond purity may be further enhanced by adding 15-20% (vol.) of CO to the feed gases, which CO promotes dissociation of oxygen which will remove graphite. In an alternative embodiment, the gases NMHC are delivered in a substantially nonmixed condition past said filament and are substantially mixed for the first time at the surface of the substrate.

The hot filament chemical vapor deposition technique is carried out at a pressure in the range of 1-500 Torr; the feed gases are maintained in a ratio of NMHC gas to hydrogen of 0.1-5.0% by volume of the gas mixture. The filament is spaced upstream from the substrate a distance preferably within the range of 2-20 mm, and the filament material content may be selected from the group consisting of tungsten, tantalum, and rhenium.

The thickness of the diamond deposited crystal structures is controlled to a thickness of 0.1-10 microns by continuing steps (a) and (b) of the process for a period of time of about 0.1-4 hours. The growth rate of such crystalline structures range from 0.1-10 microns per hour depending principally upon the NMHC concentration, filament temperature, and substrate temperature. The growth rate of said diamond crystallite structure may be optimized by elevating the filament temperature to the range of 2400°-2500° C. and by directing the feed gases in a nonmixed condition through the filament and thence mixed together for the first time at the surface of the substrate.

DETAILED DESCRIPTION AND BEST MODE

Diamond Formation Mechanics

Figure 1:
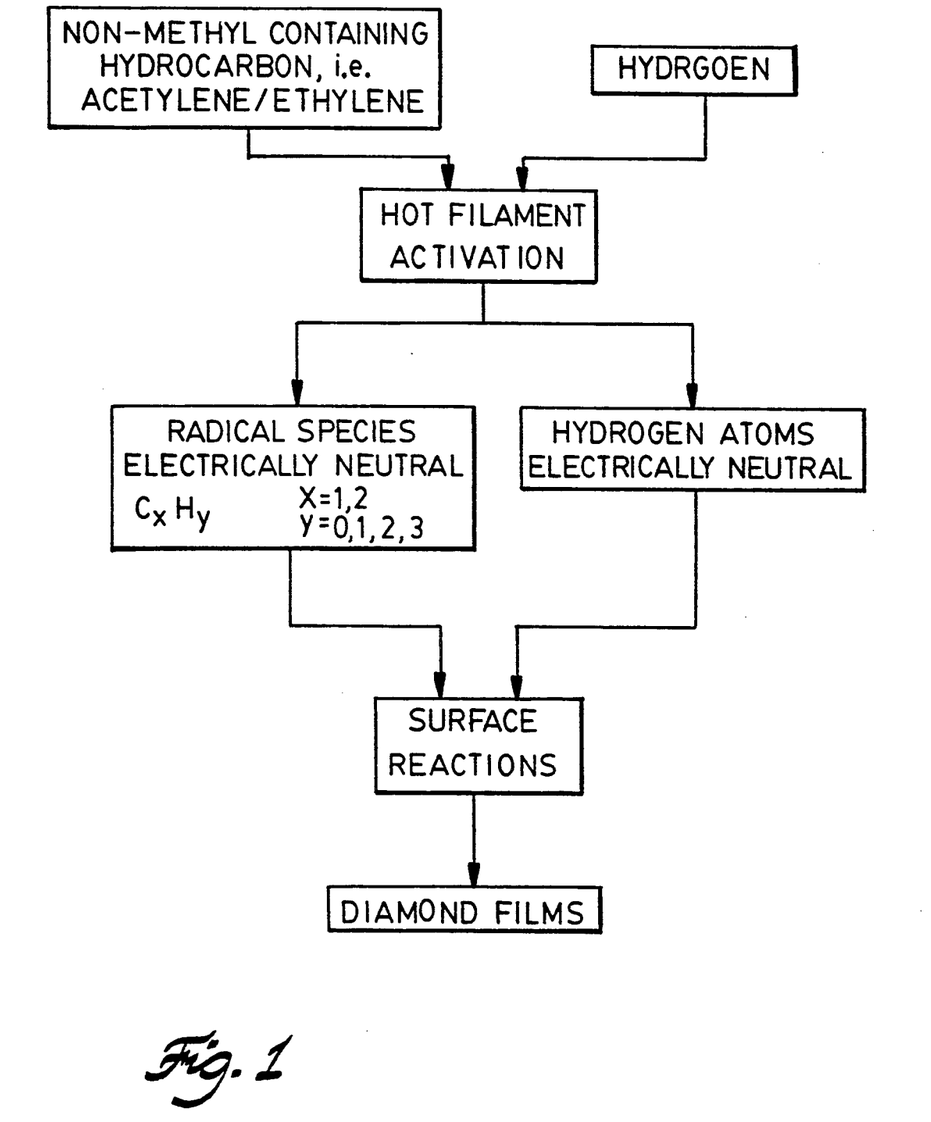
FIG. 1 is a block diagram of the mechanism of diamond formation using the process of this invention.

Turning first to FIG. 1, the mechanism of diamond formation for the process herein begins with separate feed gases of (i) non-methyl group hydrocarbon (NMHC), and (ii) hydrogen, the major constituent of such gases being passed through or over a hot filament which Promotes the formation of electrically neutral radical species and hydrogen atoms. The dominant radical species, resulting from the use of acetylene or ethylene as the hydrocarbon are believed to be C, CH, $CH_2$, $CH_3$ and $C_2$, $C_2H$, and $C_2H_3$. These radical species diffuse and react with each other either in the gas phase or on the substrate surface. Only certain species reacted on substrate surface are responsible for diamond growth (i.e., those species containing $C_2$).

The carbon balance [defined to mean 100X (total carbon in hydrocarbon and compounds detected by gas chromatograph)/(total carbon in feed gases)]is about 60% between 1500°-1900° C. due to thermal diffusion, but at 1900° C. there begins a dramatic additional loss of carbon which is believed to be due to the formation of carbon clusters (or diamond building precursors). These elementary carbon clusters are partially frozen by thermal diffusion (defined to mean herein molecular diffusion caused by the temperature and gradient) and thus form a nonequilibrium or 'supersaturated' state at the substrate surface that leads to deposition of diamond. Such thermal diffusion depends upon a critical filament heating of the flow of gases, the filament being placed substantially immediately upstream of the substrate while maintaining the substrate to a critical threshold temperature.

Apparatus

Figure 2:
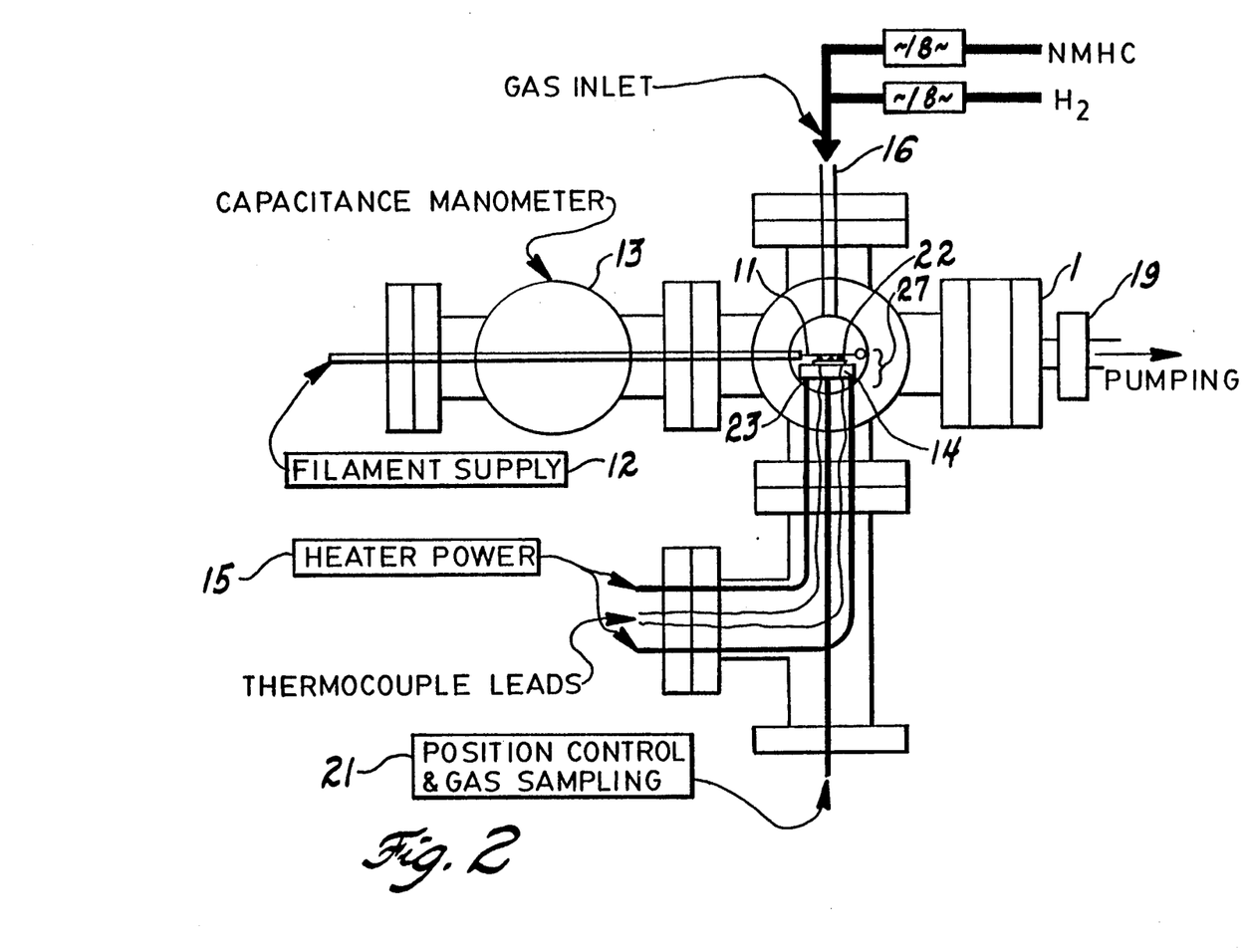
FIG. 2 is an apparatus effective for carrying out the process invention herein.

The apparatus useful for effecting such low pressure hot filament CVD diamond deposition is shown in FIG. 2. It comprises a reactor 10 and a filament grid 11 supplied with appropriate power from a supply 12. A substrate heater 14 is placed adjacent the filament and is supplied with appropriate power from a supply 15. The feed gas is introduced through one or more tubes 16 which are precontrolled by mass flow controllers 18. The gases are pumped from the reactor by means of a mechanical rough pump 22. The pressure of gases in the reactor (1-1500 Torr) is measured and controlled by a capacitance manometer 13 and a variable control valve 17. The heater pedestal is adjustable with respect to its distance from the filament by an adjuster 21. The temperature of the substrate 22 which is to be placed upon the heater pedestal is monitored by thermocouple 23 (type K, 0.01 inch diameter). A sample of the gases passing through the reactor may be made by the gas sampling tube extending along with the position controller.

The reactor used is a 1.5 inch OD stainless steel six-way cross reactor and the filament is a 'W' shape filament grid comprised of rhenium having a wire diameter of about 0.010 inches and covering a grid area of about one square inch at the center of the reactor; the size of the filament reactor can be varied. The filament is heated with low voltage (i.e., 40 volts) AC power and the temperature (1500°-2500° C.) is monitored and controlled using a two-color optical pyrometer controller. The substrate temperature (600°-1100° C.) is controlled with a temperature controller.

The gas mixture is injected from ceramic tube 16 (0.25 inch OD) at 0.75 inch above the filament. In the embodiment of FIG. 2, the gas mixture of known composition is premixed prior to introduction to the reactor chamber by use of mass flow controllers. However, alternatively, the hydrocarbon gases may be introduced separately through the use of a separate ceramic inlet tube (entering from the side or around the filament) and directed to impinge the hydrocarbon gas at a location immediately downstream of the filament (after the hydrogen gas has passed through the grid 11) to mix at or adjacent the surface of the substrate.

The total pressure (typically about 50 Torr) in the reactor is monitored with capacitance manometer 13 and controlled by a controller 18 and variable valve 17. The gas temperature is measured with a platinum/platinum + 13% rhenium thermocouple. The operating conditions of the reactor are stable during diamond deposition and chemical analysis, with maximum variation in filament or substrate temperatures of plus or minus 2° C., flow rates of plus or minus 0.05 sccm, and pressure of plus or minus 0.2 Torr.

For gas analysis, a position adjustable uncooled quartz microprobe with a conical tip containing an inlet orifice can be installed beneath the filament grid, replacing the substrate heater. Gas analysis is performed after the desired process conditions are reached and stabilized. A sampling valve is opened momentarily to pump out the gas in the probe and to withdraw fresh gas mixture through the probe to a gas sample loop. When the desired pressure in the sample loop is reached, the gas was injected into a dual column, dual detector gas chromatograph. Hydrocarbons were analyzed using a flame ionization detector. Inorganic gases, such as $O_2$, $N_2$, CO, and $CO_2$, were analyzed using a concentric column with a thermal conductivity detector. The detection limits were 0.5 ppm and 0.05% for hydrocarbons and inorganic gases, respectively.

Process

The substrate is positioned within the reaction chamber so that it is within a distance of 2–20 mm of the gas heating filament, preferably 4–10 mm. The substrate can be any material that will withstand processing temperatures up to 1000° C. and may include silicon, quartz, molybdenum, copper, inert ceramics, and other high temperature metals. The size of the substrate for purposes of the first mode herein was 0.5 cm square, with the external diameter of the reaction chamber being 1.5 inches. The size of the substrate cannot be greater than the gas flow throat area; the greater gas flow permits greater substrate. Preferably, the substrate 22 is positioned on the heater pedestal 14 which may be comprised of molybdenum and a graphite foil heating element. The pedestal operates as a heating device for raising the temperature of the substrate by radiation and conduction. Other equivalent heating means may be substituted for heating the substrate, particularly its bottom side.

Gas components, comprised of a non-methyl hydrocarbon gas (acetylene or ethylene) diluted in hydrogen, were introduced into the reaction chamber as a flow, typically at an ambient supply temperature and at a flow rate of about 100 sccm. The gas makeup of the flowing gas is preferably comprised of 0.5–2% by volume acetylene or ethylene and the remainder hydrogen. The rate of flow of the gas must be controlled to save feed gases and provide sufficient time of reaction.

The temperature of at least the major constituent of the introduced gases is raised by use of a hot filament grid 11 which has a temperature in the range of 1900°–2600° C. The filament is preferably formed as a grid of criss-crossing wires through which the gases flow to increase gas contact. The time of exposure of the substrate to the elevated gases for purposes of diamond film growth is in the range of about 0.1–4 hours. The substrate heater is raised to a temperature within the range of 800°–1000° C. and is maintained energized for the same period of time the filament is employed.

The heating of the gases and substrate is carried out for a period of time sufficient to promote a diamond film thickness in the range of 0.1–10 microns. The growth rate of such diamond film will be in the range of 0.1–1.0 microns per hour when using an average filament temperature of about 2000° C. and will be in the range of 4–10 microns per hour when using an average filament temperature of 2500° C. The resulting quality of such deposited diamond film is greater than 99.99% pure and will have an average crystal size of less than 1000 angstroms. The density of such diamond film will be about 3.1.

To promote greater purity of the deposited diamond using the premixed gas mode, CO may be introduced with the gas mixture in an amount of 15–20% by volume. The CO operates to stimulate dissociation of oxygen which removes graphite as an impurity.

Gas Conversion Dynamics

Figure 3:
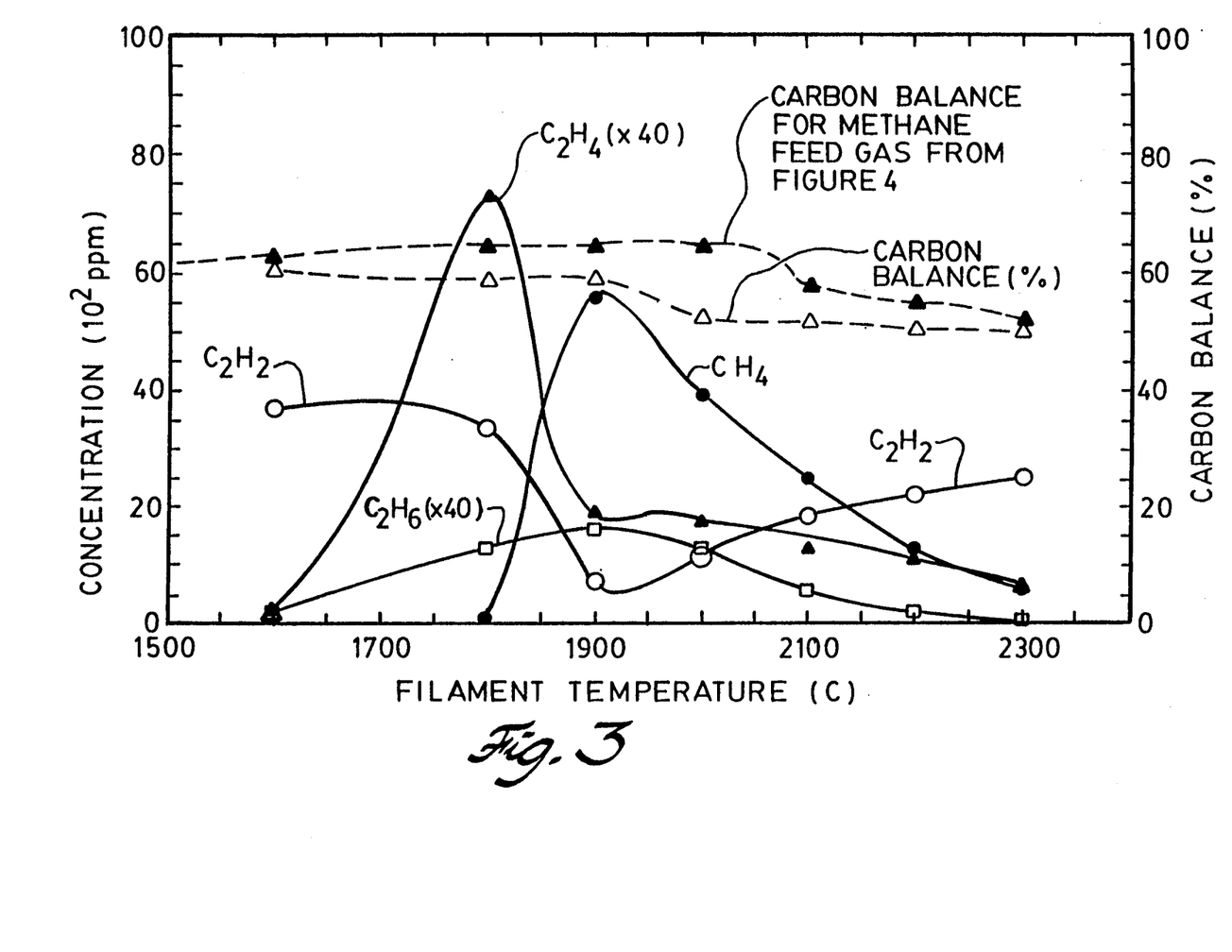
FIGS. 3-4 are graphical illustrations of gas content at the vicinity of the substrate as a function of filament temperature; the hydrocarbon component of the feed gas being acetylene in FIG. 3 and methane in FIG. 4.
Figure 4:
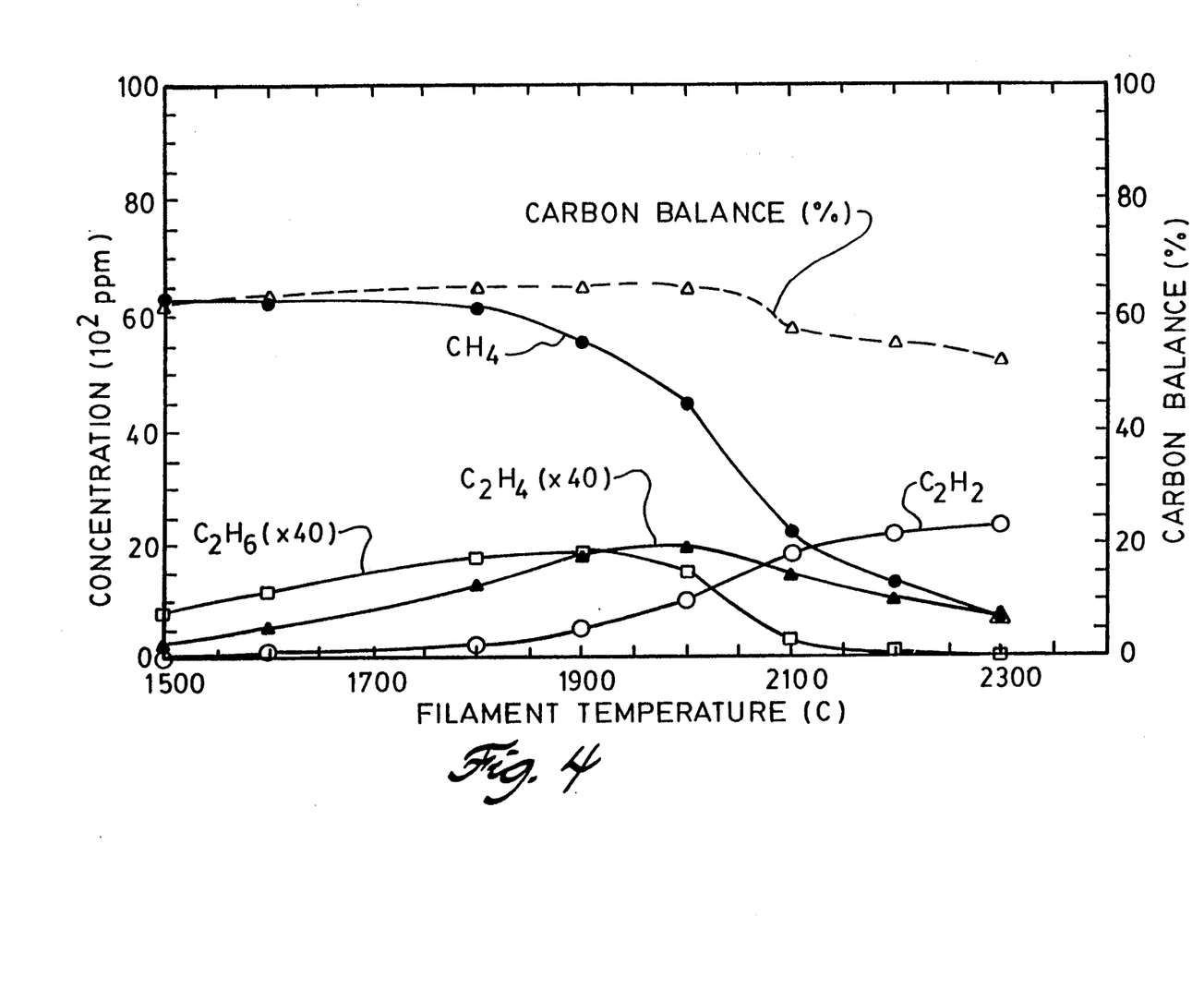
Figure 5:
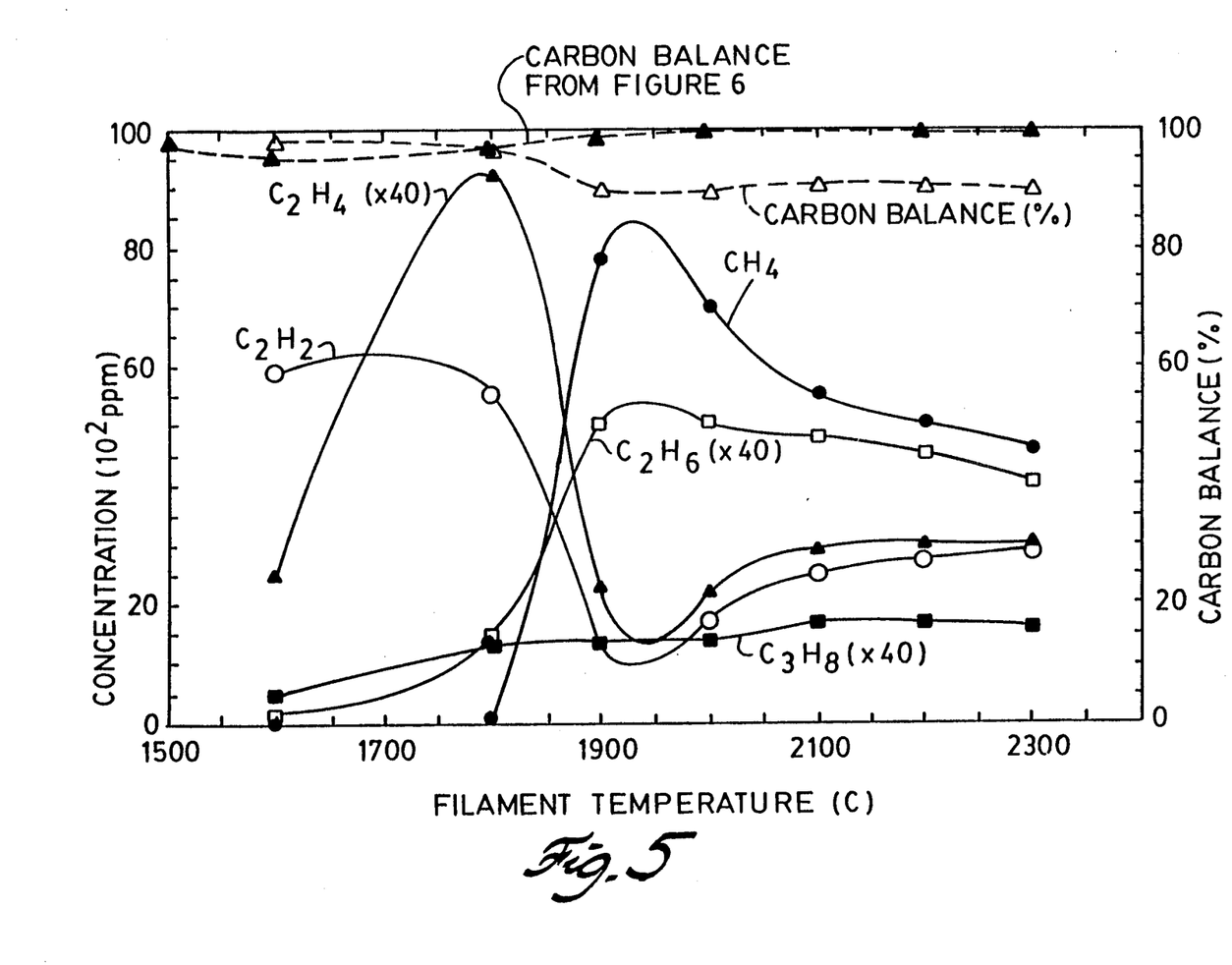
FIGS. 5-6 are graphical illustrations of gas content at a location remote from the filament as a function of filament temperature, the hydrocarbon component of the feed gas being acetylene in FIG. 5 and methane in FIG. 6.
Figure 6:
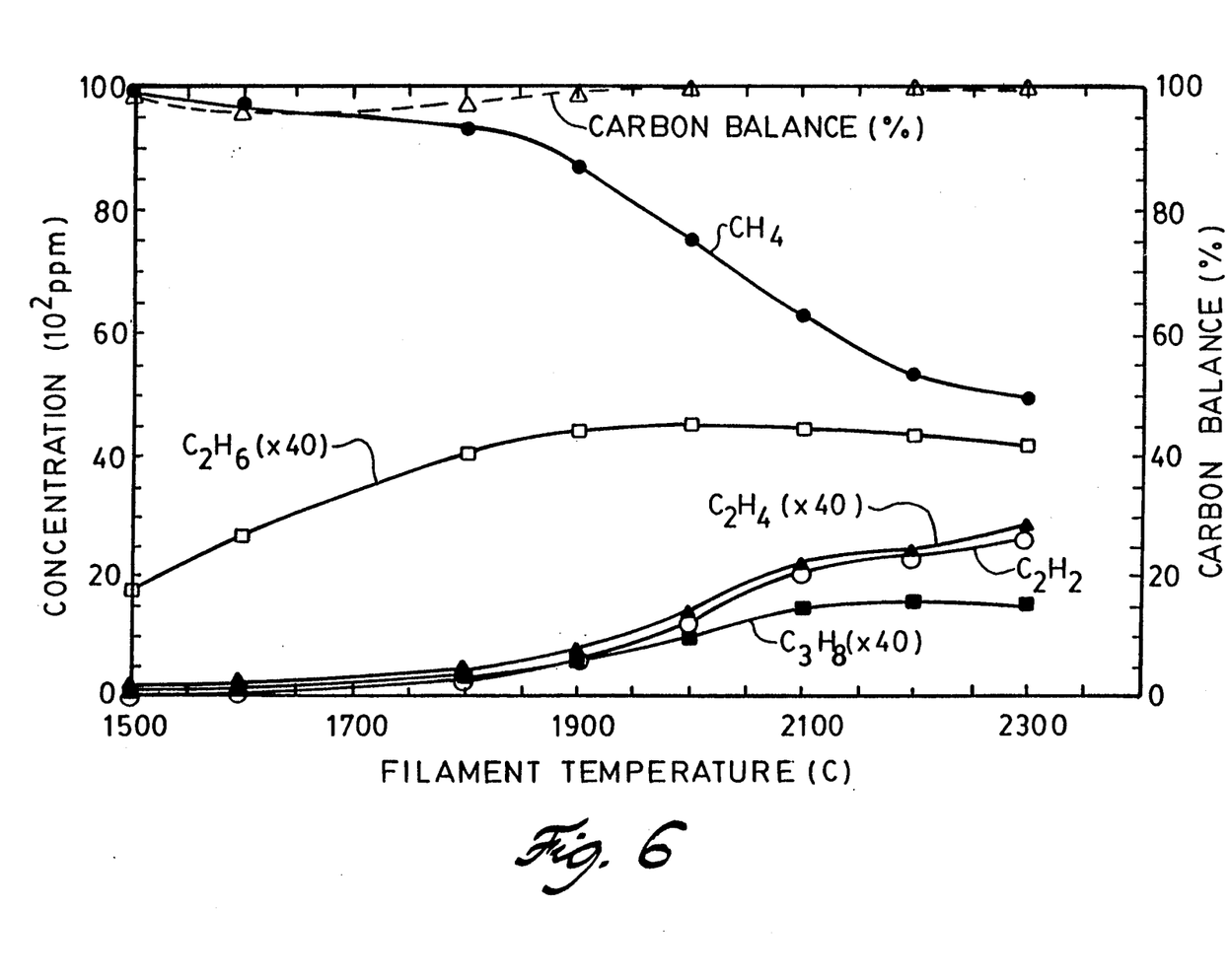

FIGS. 3–6 depict concentration profiles of the major hydrocarbon species in the gas mixture, at a position of about 5 mm below the filament as a function of filament temperature in FIGS. 3–4, and at a position of of about 100 mm from the filament for FIGS. 5–6.

The conditions for FIG. 3 included an initial hydrocarbon feed gas of $C_2H_2/H_2$ mixture with $C_2H_2$ being 0.6%. The gases were premixed prior to entering filament. $C_2H_2$ is converted back to $CH_4$ between a filament temperature of greater than 1800° C. The concentration of methane increases initially and reaches a maximum at about 1900° C. and then decreases thereafter. The concentration of acetylene decreases to a minimum at 1900° and then surpasses that of methane at filament temperatures above 2150° C. Note that the concentration of methane is higher than that of acetylene for the range of filament temperatures of 1850°–2150° C. in FIG. 3. The gas mixture undergoes a series of chemical reactions to reform methane involving the formation of ethylene and ethane intermediates.

The gas flow of FIG. 4 comprises $CH_4/H_2$, with methane being 1.1% by volume; the total flow rate was 100 sccm and the total pressure was 50 Torr. The main chemical transformation system in this figure is the conversion of methane to acetylene with increasing filament temperature. The conversion is low at filament temperatures less than 1800° C., but increases rapidly at filament temperatures greater than 1900° C. The concentration of acetylene surpasses that of methane at filament temperatures greater than 2150° C. The conversion of $CH_4$ to $C_2/H_2$ involves $C_2H_6$ and $C_2H_4$ as primary intermediates. $C_2H_6$ is formed by the recombination of $CH_3$ radicals which are expected to be the dominant carbon-containing radicals in the mixture at low filament temperatures when the concentration of $CH_4$ is high.

The carbon balance (100 times [total measured carbon content in reaction gas]/[total carbon content in feed gas]) is about 60–65% between filament temperatures of 1500° and 2000° C. and decreases to 50° at 2300° C. (see FIG. 4).

Low hydrocarbon concentration and carbon balances measured near the filament are transient. Thermal diffusion (soret effect) occurs adjacent the filament and substrate zone 27; gas species with high mass diffuse to the cool region preferentially because of the high temperature gradient near the filament. This effect is particularly important in a light diluent gas such as hydrogen.

Carbon loss is an important indicator of gas dynamics. A substantial amount of carbon is not detected throughout the full temperature region in FIGS. 3 and 4. About 30-40% of the carbon is not accounted for at 1600° C. However, starting at about 1900° C. and continuing to about 2000° C., in FIG. 3, the carbon loss increases significantly with increasing temperatures; as much as 50% of the carbon is undetected as hydrocarbon in the gas phase. The nature of this additional carbon loss is believed to be due to conversion to elementary carbons or carbon clusters ($C_n$, where n is greater or equal to 2). Diamond growth is not observable until such *additional* carbon loss begins to take place. This *additional* carbon loss is in the range of 6-20% of regular carbon loss that is observed throughout most of the filament temperature range.

This carbon loss for acetylene should be compared to the carbon balance for a methane feed gas as superimposed in FIG. 3. You will note the carbon loss for a methane feed gas will start to take place at about 2050° C. and continue until about 2200° C. This additional carbon loss takes place at a much higher temperature (about 150° C. higher) than that for an acetylene feed gas. Not only is the carbon balance loss much more pronounced with acetylene, but it occurs at about 150°-200° C. lower than that in a methane system. Deposition at lower filament temperatures is desirable because it may contribute to equivalent quality and growth rates at lower costs. This will also result in longer filament life and less power consumption.

Turning now to FIGS. 5 and 6, gas compositions remote from the filament were examined. Hydrocarbon concentration/filament temperature profiles were sampled at the exhaust port of the system, about 100 mm from the filament. The gas composition is well mixed because the gas temperature gradient has disappeared. The concentrations of chemical species are no longer affected by thermal diffusion. While moving downstream of the filament, the gas mixture appears to undergo a series of chemical reactions to reform methane. The presence of continued chemical activity is further evident from the observation of new products such as propane ($C_3H_8$) in FIGS. 5 and 6.

In the distance zone of 2-20 mm, the gas composition appears to be partially frozen to form a nonequilibrium or "supersaturated" state. This phenomenon is caused by thermal diffusion since it distributes species independent of their chemical reactivities. This supersaturated state is a cause for deposition of diamond instead of graphite.

Measurable diamond growth rates are obtained only at filament temperatures that exceed 1800° C. corresponding to the onset of significant conversion between methane and acetylene and the additional carbon loss. The measured diamond growth rates 0.05-0.7 microns per hour increase with increasing filament temperature over the range studied. When the filament temperature is raised to an average of about 2500°-2600° C., diamond growth rates of 4-10 microns per hour were experienced. This rate profile seems to correlate well with the concentration profiles of acetylene.

Diamond Film Characteristics

Figure 7:
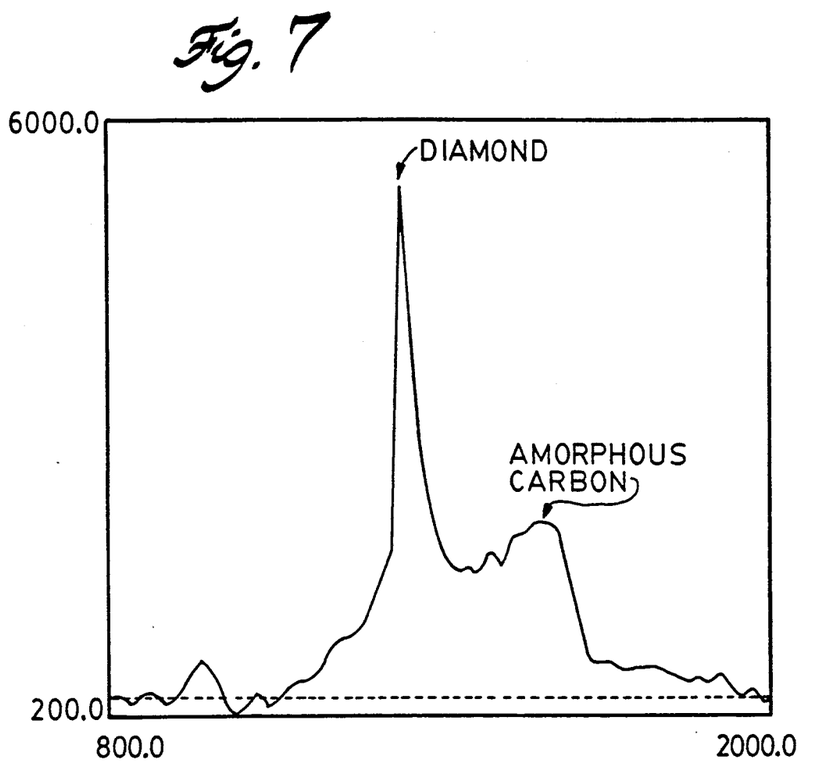
FIGS. 7-8 are low resolution Raman spectrums of diamond crystallite structures deposited in accordance with this invention, FIG. 7 resulting from the use of the method mode where the gases are premixed prior to filament passage and FIG. 8 from the method mode where the gases are mixed only at the reaction surface.
Figure 8:
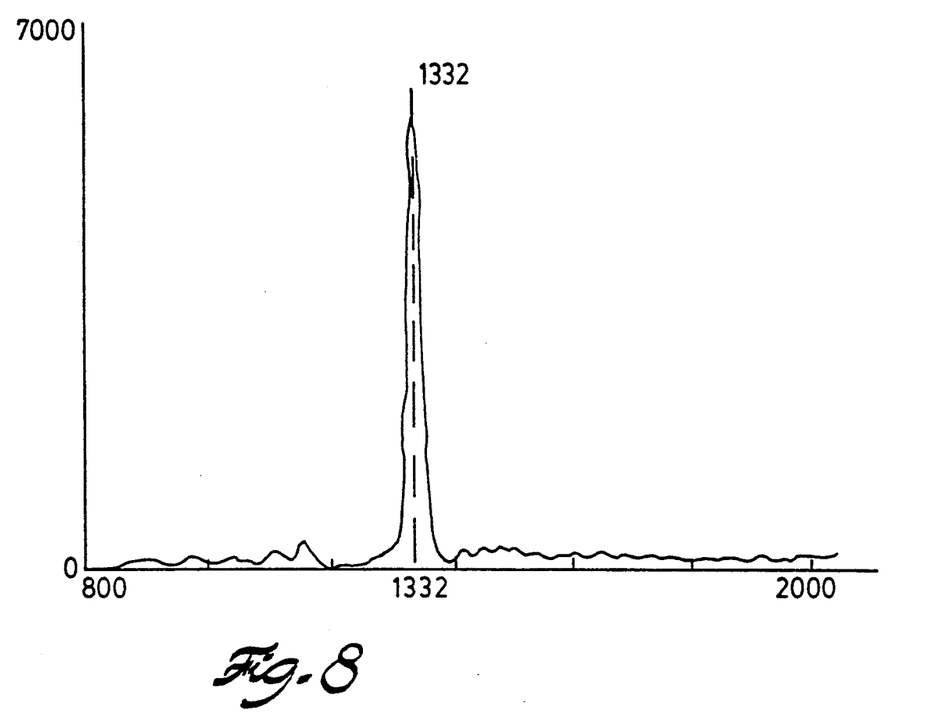

The diamond films produced have uniform crystalline structures. The presence of diamond is confirmed by Raman spectroscopy and scanning electron microscopy (SEM). As shown in FIG. 7, a typical Raman spectrum (20 cm ) shows a diamond peak at about 1332 cm[1] with an amorphous carbon peak occurring at about 1535. Since graphite signals appear 50 times larger in comparison to that for diamond, the relative proportion of such peaks indicates that there is only a very small amount of graphite and that the purity of the diamond film is greater than 99.99% pure. As shown in FIG. 8, the spectrum for diamond deposition using nonmixed feed gases (to be mixed only at the substrate surface) shows an even greater enhancement in purity with substantially no graphite peaks.

Figure 9:
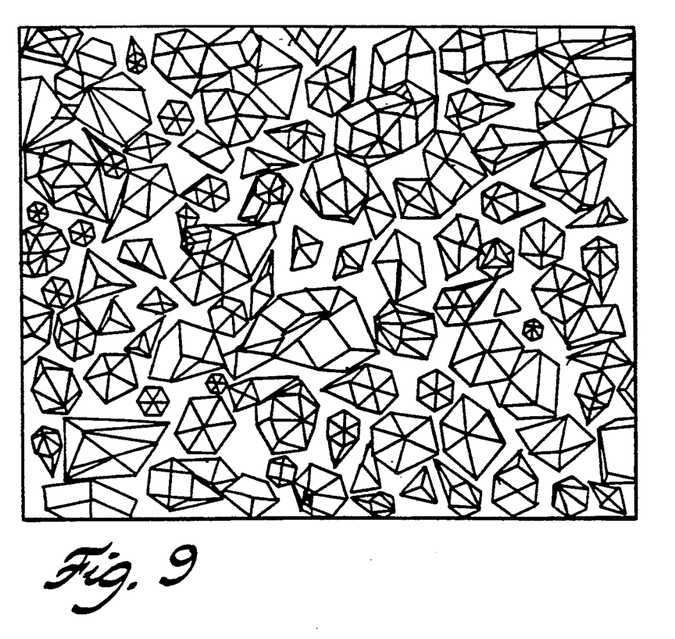
FIG. 9 is a scanning electron microscope microgram of diamond crystals deposited in accordance with this invention.

As shown in FIG. 9 (for a deposition using premixed gases), the diamond particles are of generally uniform size within the range of 4-6 microns and create a dense coating.

While particular embodiments of the invention have been illustrated and described, it will be obvious to those skilled in the art that various changes and modifications may be made without departing from the invention, and it is intended to cover in the appended claims all such modifications and equivalents as fall within the true spirit and scope of this invention.

We claim:

1. A method of growing high purity diamond crystallite structures at high growth rates on a substrate that can withstand high temperatures, comprising the steps of:
   (a) flowing diamond producing feed gases at low pressures through a reaction chamber containing said substrate, said feed gases being substantially devoid of methyl group gases; and
   (b) raising the temperature of said substrate to 600°-1000° C. and concurrently thermally activating said feed gases by use of a hot filament located within said chamber and upstream as well adjacent said substrate, said filament being heated to a temperature above 1900° C. that is effective to generate substantial neutral radicals or diamond precursors.

2. The method as in claim 1, in which step (b) is effective to generate a substantial loss in carbon balance for said gases at or above 1900° C.

3. The method as in claim 1, in which in step (a) said gases consist of acetylene and hydrogen, with said gases being mixed prior to passing said filament.

4. The method as in claim 1, in which said diamond producing gases are hydrogen and non-methyl hydrocarbons, the non-methyl hydrocarbon gas being selected from the group consisting of acetylene and ethylene.

5. The method as in claim 1, in which said feed gases flow into said reaction chamber at a flow rate of about 5-500 sccm, at a pressure in the range of 1-500 Torr, and at a ratio of hydrocarbon to hydrogen of 0.5-5.0% by volume.

6. The method as in claim 1, in which said substrate is comprised of a material that can maintain structural integrity at temperatures up to 1000° C.

7. The method as in claim 6, in which said substrate material is selected from the group consisting of silicon, quartz, molybdenum, copper and inert ceramics.

8. The method as in claim 1, in which the temperature to which said film is raised is in the range of 1900°-2600° C.

9. The method as in claim 1, in which said filament is comprised of a material selected from the group consisting of tungsten, tantalum, and rhenium.

10. A method of growing high purity diamond crystallite structures at high growth rates on a substrate that can withstand high temperatures, comprising the steps of:

(a) positioning said substrate within a reaction chamber spaced from a heating filament a distance of 2-20 mm;

(b) flowing diamond producing feed gases at low pressures through such reaction chamber, said feed gases being substantially devoid of methyl group gases and having a hydrocarbon selected from the group consisting of acetylene and ethylene diluted by hydrogen; and (c) raising the temperature of the substrate to the range of 600°-1000° C. while concurrently thermally activating said feed gases by use of said hot filament heated to a temperature greater than 1900° C. to generate a substantial loss in the carbon balance of said gases.

11. The method as in claim 10, in which in step (b) said gases consist of acetylene and hydrogen, said gases being delivered in a substantially nonmixed condition past said filament and are mixed at the surface of the substrate.

12. A method of rapidly depositing high purity dense diamond crystalline structures onto a substrate, comprising the steps of:

(a) introducing acetylene or ethylene gas diluted with hydrogen into a reaction chamber containing said substrate, said gas mixture being devoid of methyl group gases;

(b) thermally activating said gas mixture by a hot filament in said reaction chamber to generate electrically neutral gas radicals and atomic hydrogen which react at the substrate surface to deposit one or more successfully adherent polycrystalline diamond layers, said layers being substantially free from intercrystalline binders and having an extremely low content of impurities.

13. The method as in claim 12, in which said feed gas additionally contains carbon monoxide to improve purity of diamond film.

14. The method as in claim 12, in which the hydrogen feed gas is passed through the filament and said acetylene or ethylene feed gas is passed around said filament, said gases being mixed at or about the surface of the substrate.

* * * * *